United States Patent
Meier et al.

(10) Patent No.: US 6,703,295 B2
(45) Date of Patent: Mar. 9, 2004

(54) METHOD AND APPARATUS FOR SELF-DOPING CONTACTS TO A SEMICONDUCTOR

(75) Inventors: Daniel L. Meier, Pittsburgh, PA (US); Hubert P. Davis, Pittsburgh, PA (US); Ruth A. Garcia, Irwin, PA (US); Joyce A. Jessup, McKeesport, PA (US)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/405,298

(22) Filed: Apr. 1, 2003

(65) Prior Publication Data

US 2003/0203603 A1 Oct. 30, 2003

Related U.S. Application Data

(63) Continuation of application No. 09/538,034, filed on Mar. 29, 2000.
(60) Provisional application No. 60/167,358, filed on Nov. 23, 1999.

(51) Int. Cl.[7] .............................................. H01L 21/24
(52) U.S. Cl. ...................... 438/537; 438/659; 438/661; 438/686
(58) Field of Search ................................. 438/530, 533, 438/537, 538, 557, 607, 659, 661, 686, FOR 294, FOR 348

(56) References Cited

U.S. PATENT DOCUMENTS

| 2,998,334 A | 8/1961 | Bakalar et al. |
| 3,767,482 A | 10/1973 | Kock et al. |
| 4,159,215 A | 6/1979 | Chang et al. |

(List continued on next page.)

FOREIGN PATENT DOCUMENTS

| AU | 39452/68 | 2/1970 |
| DE | 29 39 541 A1 | 4/1981 |
| GB | 1416964 | 12/1975 |
| JP | 09191118 | 7/1997 |
| WO | WO 98/50944 | 11/1998 |

OTHER PUBLICATIONS

Ciszek, T. F., et al.: "Si Thin Layer Growth from Metal Solutions on Single–Crystal and Cast Metallurgical–Grade Multicrystalline Si Substrates"; Proceedings of the 23rd IEEE Photovoltaics Specialists Conference; Louisville, Kentucky; May 10–14, 1993; pp. 65–72.

(List continued on next page.)

*Primary Examiner*—George Fourson
*Assistant Examiner*—Joannie Adelle Garcia
(74) *Attorney, Agent, or Firm*—Squire, Sanders & Dempsey L.L.P.

(57) ABSTRACT

The present invention provides a system and method for creating self-doping contacts to silicon devices in which the contact metal is coated with a layer of dopant and subjected to high temperature, thereby alloying the silver with the silicon and simultaneously doping the silicon substrate and forming a low-resistance ohmic contact to it. A self-doping negative contact may be formed from unalloyed silver which may be applied to the silicon substrate by either sputtering, screen printing a paste or evaporation. The silver is coated with a layer of dopant. Once applied, the silver, substrate and dopant are heated to a temperature above the Ag—Si eutectic temperature (but below the melting point of silicon). The silver liquefies more than a eutectic proportion of the silicon substrate. The temperature is then decreased towards the eutectic temperature. As the temperature is decreased, the molten silicon reforms through liquid-phase epitaxy and while so doing dopant atoms are incorporated into the re-grown silicon lattice. Once the temperature drops below the silver-silicon eutectic temperature the silicon which has not already been reincorporated into the substrate through epitaxial re-growth forms a solid-phase alloy with the silver. This alloy of silver and silicon is the final contact material, and is composed of eutectic proportions of silicon and silver. Under eutectic proportions there is significantly more silver than silicon in the final contact material, thereby insuring good electrical conductivity of the final contact material.

5 Claims, 6 Drawing Sheets

U.S. PATENT DOCUMENTS

| | | | |
|---|---|---|---|
| 4,163,983 | A | 8/1979 | Cline et al. |
| 4,184,897 | A | 1/1980 | Anthony et al. |
| 4,198,247 | A | 4/1980 | Anthony et al. |
| 4,207,670 | A | 6/1980 | Cline et al. |
| 4,594,602 | A | 6/1986 | Iimura et al. |
| 4,737,197 | A | 4/1988 | Nagahara et al. |
| 5,641,362 | A | 6/1997 | Meier |
| 6,180,869 | B1 | 1/2001 | Meier et al. |

OTHER PUBLICATIONS

Lolgen, P., et al.; "Boron Doping of Silicon Using Coalloying With Aluminum"; Applied Physics Letters, Dated Nov. 28, 1994; pp. 2792–2794; vol. 65 (22).

Wang, T. H., et al.; "Growth Kinetics Studies of Silicon LPE from Metal Solutions"; Proceedings of the $1^{st}$ World Conference and Exhibition on Photovoltaic Solar Energy Conversion; Waikoloa, Hawaii; Dec. 5–9, 1994; pp. 1250–1253.

Gee, James, M., et al.; "Boron–Doped Back–Surface Fields Using An Aluminum–Alloy Process"; Proceedings of the $26^{th}$ IEEE Photovoltaics Specialists Conference; Anaheim, California; Sep. 30–Oct. 3, 1997; pp. 275–278.

Salami, Jalal, et al.; "Self–Aligned Locally Diffused Emitter (SALDE) Silicon Solar Cell"; Solar Energy Materials and Solar Cells; 1997; pp. 159–165.

Meier, D.L., et al., "Self–Doping Contacts and Associated Silicon Solar Cell Structures"; $2^{nd}$ World Conference and Exhibition on Photovoltaic Solar Energy Conversion; Vienna, Austria; Jul. 6–10, 1998; pp. 1491–1494.

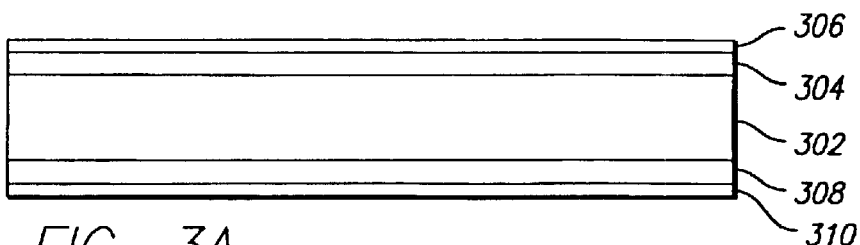
FIG. 3A
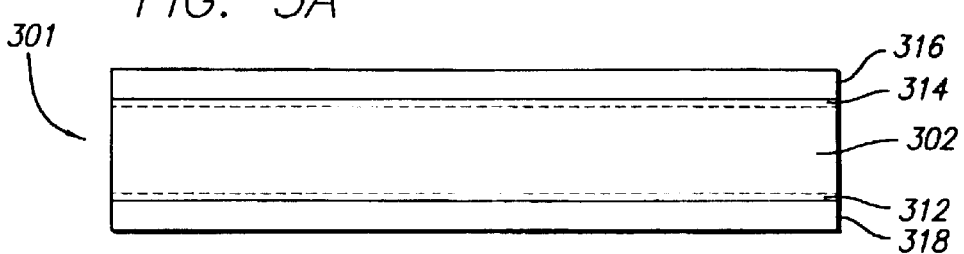
FIG. 3B
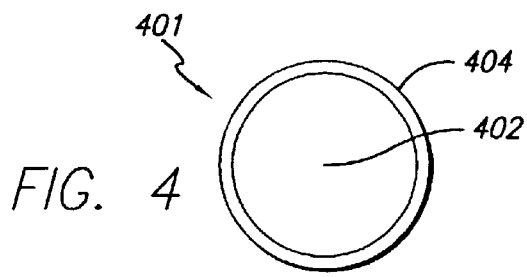
FIG. 4
FIG. 5
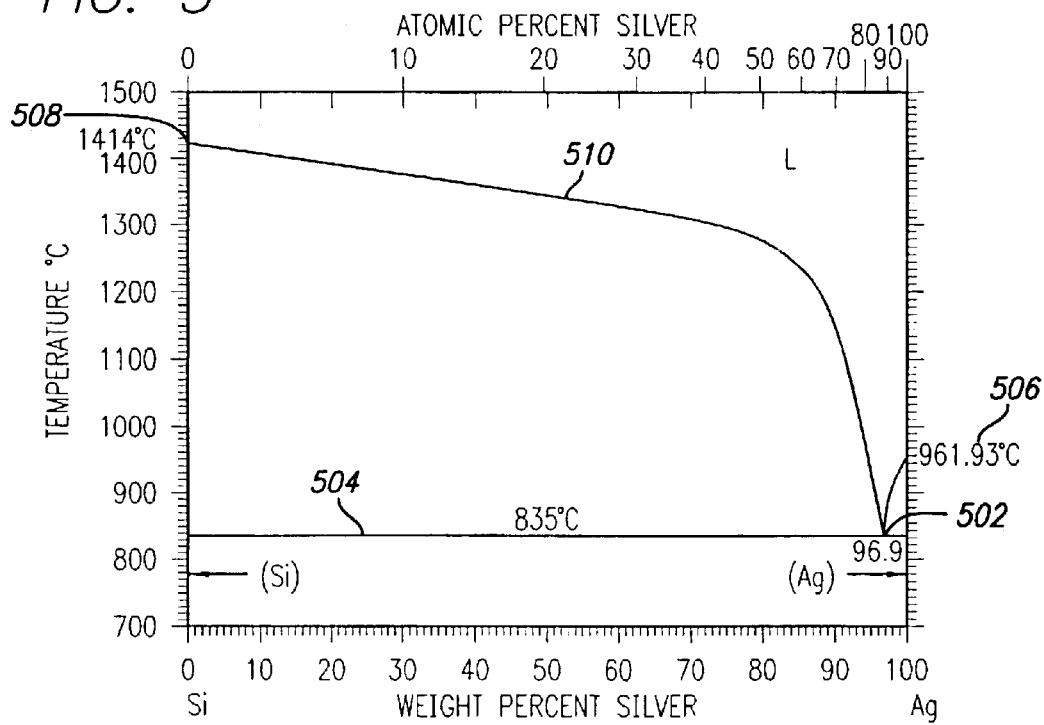

METHOD AND APPARATUS FOR SELF-DOPING CONTACTS TO A SEMICONDUCTOR

PRIORITY REFERENCE TO PRIOR APPLICATIONS

This application is a continuation of U.S. patent application Ser. No. 09/538,034, which is incorporated herein by reference, entitled "Method for Self-Doping Contact to A Semiconductor", filed Mar. 29, 2000, to inventors Daniel L. Meier et al., which claims the benefit of U.S. Provisional Application 60/167,358, filed Nov. 23, 1999, to Daniel L. Meier, Hubert P. Davis, Ruth A. Garcia and Joyce A. Jessup, entitled "Self-Doping Contacts to Silicon Using Silver Coated with a Dopant Source", under 35 U.S.C. §119(e), which is herein incorporated by reference.

BACKGROUND OF THE INVENTION

1. Field of the Invention

The present invention relates to metal contacts to silicon substrates and other semiconductors in which the contact material includes a supply of dopant atoms, thereby acting as its own dopant source, to facilitate the formation of a low-resistance ohmic contact between the contact material and the substrate.

2. Description of the Background Art

In a properly designed p-n junction solar cell, the electrons move to the metal electrode which contacts the n-type silicon, and the holes move to the metal electrode which contacts the p-type silicon. These contacts are vitally important to the performance of the cell, since forcing current across a high resistance silicon/metal interface or through a high resistance electrode material robs useful power from the cell. The total specific series resistance of the cell, including interfaces and electrode material, should be no more than 1 $\Omega$-cm$^2$.

The need for a low-resistance contact places a fairly demanding requirement on the concentration of dopant atoms at the surface of the semiconductor. For n-type silicon, this dopant concentration must be $\geq 1 \times 10^{19}$ atoms/cm$^3$ (which is 200 parts per million atomic (ppma) based upon a density for silicon of $5 \times 10^{22}$ atoms/cm$^3$). For p-type silicon the requirement is less severe, with a surface concentration $\geq 1 \times 10^{17}$ atoms/cm$^3$ (2 ppma) being required. Furthermore, to maximize the light energy to electrical energy conversion efficiency it is often desirable to have a lower surface doping concentration everywhere on the illuminated side except directly beneath the metal electrode, especially for the n-type surface. Thus, an ideal contact material is one which supplies a liberal amount of dopant to the silicon immediately beneath it (also known as self-doping), has a high electrical conductivity, makes a mechanically strong bond to the silicon, and does not degrade the electrical quality of the silicon by introducing sites where electrons and holes can be lost by recombination. Finally, this ideal contact material should be inexpensive and should lend itself to being applied by an economical process such as screen printing.

A known contact material which possesses, to a significant extent, the above-described desirable properties, is aluminum. Aluminum possesses these properties when used for contacting p-type silicon and therefore forming the positive electrode in a silicon solar cell. This is due to the fact that aluminum itself is a p-type dopant in silicon. Aluminum can dope silicon, as part of a process which alloys the aluminum with the silicon, provided the processing temperature exceeds the aluminum-silicon eutectic temperature of 577° C.

For conventional solar cell structures the lack of a material, comparable to aluminum, for contacting n-type silicon in order to form the negative electrode of a solar cell, makes the fabrication of a simple, cost-effective solar cell difficult. In a conventional solar cell structure with a p-type base, the negative electrode (which contacts the n-type emitter) is typically on the front (illuminated) side of the cell and the positive electrode is on the back side. In order to improve the energy conversion efficiency of such a cell, it is desirable to have heavy doping beneath the metal contact to the n-type silicon and light doping between these contacts. Thus, the conventional silicon solar cell structure presently suffers from a loss of performance because of the opposing demands for high doping density beneath the contact metal and low doping density between the contact metal areas.

Existing technology for solar cell contacts to silicon (Si) utilize a silver (Ag) paste with glass frit (e.g., Ferro 3347, manufactured by the Electronic Materials Division of Ferro Corporation, Santa Barbara, Calif.) fired at $\approx 760°$ C. The glass frit promotes adhesion of the Ag layer to the Si surface. Such a contact requires a Si substrate which already has a heavily-doped surface layer (sheet resistance<45 $\Omega$/□). The interface between the Si and the contact material usually dominates the series resistance of the entire cell. Thus, this technology also forces the cell designer to create a surface layer which is more heavily-doped than desired in order to bring the interface resistance to an acceptable level.

Therefore, what is needed is a method and apparatus for self doping contacts to a semiconductor, said contacts being heavily doped beneath the bonding point to the semiconductor but lightly doped between the contacts, having high electrical conductivity, and a strong mechanical bond which is easily fabricated and cost effective.

SUMMARY

The present invention provides a system and method for creating self-doping contacts to silicon devices in which the contact metal is coated with a layer of dopant, alloyed with silicon and subjected to high temperature, thereby simultaneously doping the silicon substrate and forming a low-resistance ohmic contact to it.

A self-doping negative contact may be formed from unalloyed Ag which may be applied to the silicon substrate by either sputtering, screen printing a paste or evaporation. The Ag is coated with a layer of dopant. Once applied, the Ag, substrate and dopant are heated to a temperature above the Ag—Si eutectic temperature (but below the melting point of Si). The Ag liquefies more than a eutectic proportion of the silicon substrate. The temperature is then decreased towards the eutectic temperature. As the temperature is decreased, the molten silicon reforms through liquid-phase epitaxy and while so doing dopant atoms are incorporated into the re-grown lattice.

Once the temperature drops below the silver-silicon eutectic temperature the silicon which has not already been reincorporated into the substrate through epitaxial re-growth forms a solid-phase alloy with the silver. This alloy of silver and silicon is the final contact material, and is composed of eutectic proportions of silicon and silver. Under eutectic proportions there is significantly more silver than silicon in the final contact material, thereby insuring good electrical conductivity of the final contact material.

One possible advantage of the self-doping contact includes the elimination of the need for a pre-existing heavily-doped layer, thereby reducing the number of processing steps. The elimination of the heavily-doped layer also permits the use of a more lightly-doped emitter than is possible for existing technology. This increases cell efficiency because of the resulting higher cell photocurrent. Furthermore, adhesion of the contact to the Si surface may be improved over existing technology by specifying that alloying occur between Ag and Si. An alloyed contact is more adherent than a deposited contact, even if the deposited contact has glass frit. In addition, it has been demonstrated that an alloyed 146A contact remains intact after dipping in HF, unlike a deposited contact with glass frit which is dislodged from the Si substrate by immersion in HF. Such insensitivity to HF for alloyed contacts opens processing options not available with deposited contacts.

Other possible advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

FIG. 3A shows a sectional view of an n-type Si substrate with phosphorus as the n-type dopant source and boron as the p-type dopant source;

FIG. 3B shows a sectional view of a p-n junction diode with self-doping contacts formed from the structure of FIG. 3A according to an embodiment of the present invention;

FIG. 4 shows a cross-sectional view of a silver particle coated with liquid dopant, where such a coated particle is suitable for incorporation into a screen-printing paste;

FIG. 5 shows a silver-silicon phase diagram which is utilized in accordance with the present invention;

DETAILED DESCRIPTION OF PREFERRED EMBODIMENTS

The following description is provided to enable any person skilled in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

One approach to producing self-doping contacts uses a combination of materials and processing conditions which produces a self-doping negative electrode for silicon solar cells, similar in function to the widely-used aluminum self-doping positive electrode. Experimental results have shown that a combination of antimony as the n-type dopant and silver as the primary contact metal satisfies the basic requirements for a self-doping negative electrode. Alternatively, analogous self-doping positive electrodes have been proposed using gallium and silver. This approach requires that the contact material be applied to silicon as an alloy of silver and a dopant, such as silver-antimony or silver-gallium. Current technology for producing small (3 micron) silver particles for incorporation into a screen-printing paste utilize the precipitation of silver particles from a solution of silver nitrate, and is not suitable for producing particles composed of silver and a dopant in alloy form. Another approach introduces dopant atoms to the process separately from a remote source, generally a gas, during the heating process. Such approaches are described in U.S. patent application Ser. No. 09/072,411 to Meier and Davis, dated May 4, 1998, herein incorporated by reference.

Figure 1A:
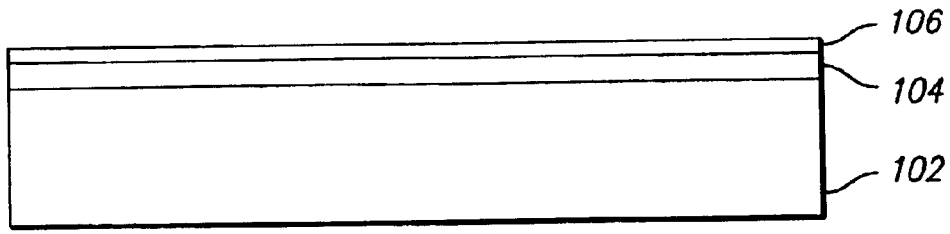
FIG. 1A shows a sectional view of a Si substrate with an Ag surface coated with liquid dopant.
Figure 1B:
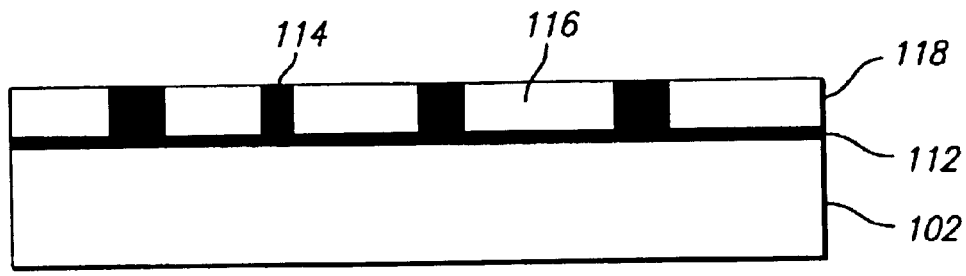
FIG. 1B shows a sectional view of the substrate of FIG. 1A after alloying, showing the formation of a heavily doped Si layer.

An embodiment of the present invention which does not require the application of an alloy of silver and a dopant or a remote doping source is illustrated in FIGS. 1A and 1B. FIG. 1A shows a sectional view of a starting structure comprising a silicon (Si) substrate 102 contacted by a layer of silver (Ag) 104 which, in turn, is coated with a layer containing a dopant 106. Ag is a widely-used contact metal because of its low electrical resistivity and solderability. The dopant layer 106 may be applied using a commercially-available liquid source. Alternatively, the Ag layer 104 and dopant layer 106 may be applied by sputtering, screen printing or evaporation.

If the temperature of this structure is raised above the Ag—Si eutectic temperature (>835° C.), Ag can alloy with Si to form a liquid pool containing Ag, Si, and the dopant. As shown in FIG. 1B, while cooling to 835° C. the Si re-grows by liquid phase epitaxy and incorporates dopant atoms into the epitaxial Si layer 112. When the temperature drops below 835° C., the liquid pool solidifies abruptly into a two-phase eutectic region 118; a Si phase 114 which also contains dopant, and a Ag phase 116 which is electrically conductive and contains some dopant as well, the two phases being in intimate contact.

A preferred conductive metal for this invention is silver. In addition to its high electrical conductivity, silver has the desirable property that its oxide is unstable at temperatures only modestly elevated above room temperature. This means that the alloying process described will yield a contact with an oxide-free surface, even if the alloying is done in air or in oxygen. The oxide-free silver contact is very well suited for soldering when cells are interconnected to form a module. In addition, the formation of a self-doping negative electrode at a temperature in the range of 835° C. to 1000° C. means its formation can be combined with the creation of a thermal oxide layer grown on the exposed silicon substrate. This oxide layer would serve to passivate the silicon surface, thereby reducing the loss of photogenerated electrons and holes by recombination at the surface.

Figure 2A:
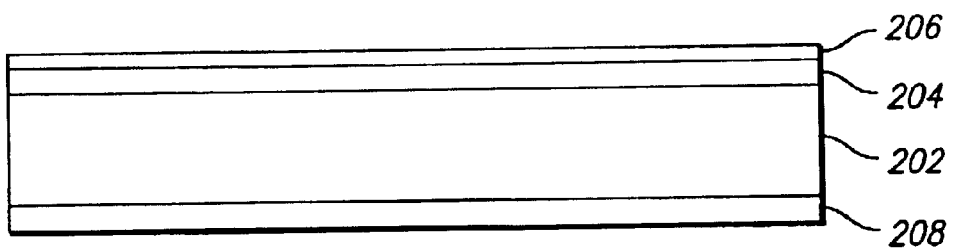
FIG. 2A shows a sectional view of an n-type Si substrate with phosphorus as the n-type dopant source and aluminum as the p-type dopant source.
Figure 2B:
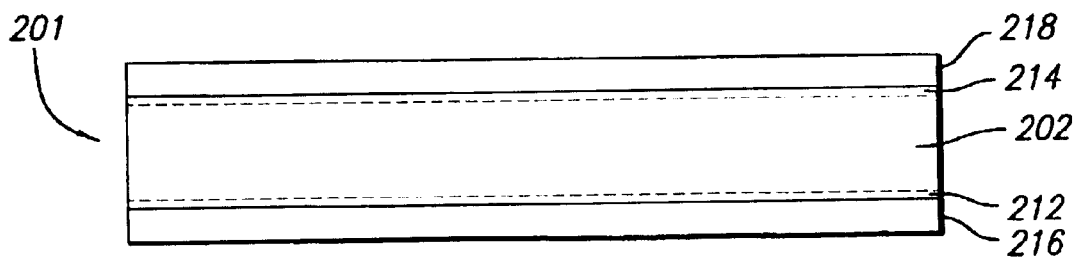
FIG. 2B shows a sectional view of a p-n junction diode with self-doping contacts formed from the structure of FIG. 2A according to an embodiment of the present invention.

This concept can now be applied to create a complete p-n junction diode from an n-type Si substrate in a single high-temperature step (>835° C.). FIG. 2A shows a sectional view of an n-type Si substrate 202 with an Ag layer 204 coated with a liquid phosphorus (P) layer 206 as the n-type dopant source and an aluminum (Al) layer 208 as the p-type dopant source. FIG. 2B shows a cross sectional view of the substrate of FIG. 2A after high temperature alloying. Al is used to form the p$^+$ region 212 as well as ohmic contact to that p$^+$ region, while Ag coated with P is used to form the n$^+$ region 214 and ohmic contact to it. The contact metals are Al—Si eutectic 216 and Ag—Si eutectic 218, respectively. The final Ag/n$^+$np$^+$/Al structure 201 constitutes a complete p-n junction diode with self doping contacts. Note that no separate dopant diffusion step is needed in this process. Dopant to create the n$^+$ and p$^+$ regions is supplied either directly by the Al or indirectly by the P coating on the Ag via the metal layers.

A second embodiment of the present invention is illustrated in FIGS. 3A and 3B. FIG. 3A shows a sectional view of an n-type Si starting substrate 302 with a first Ag layer 304 coated with a liquid P layer 306 as the n-type dopant source and a second Ag layer 308 coated with a liquid Boron (B) layer 310 as the p-type dopant source. FIG. 3B shows a cross sectional view of the substrate of FIG. 3A after high temperature alloying. Analogous to the first embodiment, B is used to form the p$^+$ region 312 as well as ohmic contact to that p$^+$ region, while Ag coated with P is used to form the n$^+$ region 314 and ohmic contact to it. The final Ag/n$^+$np$^+$/Ag structure 301 constitutes a complete p-n junction diode with first solderable Ag contacts 316 and second solderable contacts 318. Solderability follows from the fact that the oxide of Ag is volatile above room temperature, so that a clean Ag surface is present after alloying at high temperature.

A third embodiment of the present invention, shown in FIG. 4, combines two existing materials, Ag in particle form and a dopant in liquid form, to create a self-doping, screen printable paste. Rather than coat a planar Ag surface with dopant, as illustrated previously, the entire outer surface of an individual Ag particle 402 is coated with a dopant layer 404. These coated Ag particles 401 can then be introduced into a paste formulation with binders, solvents, etc., to make a screen-printing paste (not shown). Silver pastes, usually with glass frit, are widely used in the photovoltaic industry. Therefore, a dopant material which can be applied as a coating to Ag can generally function as a dopant source in the alloying process. This includes a variety of commercially-available liquid dopants such as P, antimony (Sb), arsenic (As), indium (In), aluminum (Al) and gallium (Ga). A coating of elemental Sb, Al, Ga, or In on the Ag particles may also serve as a dopant source. Since it is not uncommon for manufacturers of screen-printing pastes to coat Ag particles with a layer of material to prevent agglomeration of the small particles, the technology for applying a coating to Ag particles already exists for some materials. This embodiment of the invention in which each Ag particle in the paste is coated with liquid dopant can be applied to make screen-printing paste.

A silver-silicon phase diagram for this method is shown in FIG. 5. The vertical axis of FIG. 5 is temperature in degrees centigrade, while the horizontal axis is percentage silver. The horizontal axis has two scales: a lower scale of percent silver (by weight) and an upper scale of percent silver (atomic). A eutectic point 502 is found at 96.9% Ag and 3.1% Si (by weight). Eutectic point 502 lies on line 504 which indicates a temperature of 835° C. Also shown are the melting point 506 of Ag (961.93° C.) and the melting point 508 of Si (1414° C.). Curve 510 (which rises leftward from point 502) indicates that as the temperature is further increased above the eutectic, the percent Si, which can be held in a molten mixture of Si and Ag, also increases. Silver is therefore capable of dissolving silicon at temperatures above 835° C., and then allowing the silicon to recrystallize by liquid phase epitaxy upon cooling, in analogy with the behavior of aluminum. Unlike aluminum, however, silver is not a dopant in silicon, so a dopant, some of which will remain in the silicon upon epitaxial re-growth, must be added to the silver. From the phase diagram it can be seen that the eutectic material will have two regions (phases), a major region which is nearly pure Ag and a minor region which is nearly pure Si.

The phase diagram of FIG. 5 also gives a way of determining the amount of silicon that a given thickness of silver will dissolve. It thereby provides a means for estimating eutectic layer thickness and n$^+$n junction depth for the case where Ag is in contact with an n-type substrate and is coated with an n-type dopant. The ratio of thickness of silicon dissolved ($t_{Si}$) to thickness of silver deposited ($t_{Ag}$) at an alloying temperature (T) is given by:

$$(t_{Si})/(t_{Ag})=(\rho_{Ag})/(\rho_{Si})*[w_{Si}(T)/(100\%-w_{Si}(T))] \quad (1)$$

where $\rho_{Ag}$ is the density of silver (10.5 g/cm$^3$), $\rho_{Si}$ is the density of silicon (2.33 g/cm$^3$), and $w_{Si}(T)$ is the weight percent of silicon at the processing temperature. With $w_{Si}$ (T=835° C.) of 3.1% from the phase diagram, the thickness ratio is calculated from Equation (1) to be 0.144. Thus, the Ag—Si eutectic layer will be 1.144 times as thick as the Ag layer.

The depth of the n$^+$n junction that would be found beneath the Ag region of the eutectic layer depends on the temperature at which the alloying was done, as indicated by Equation (1). (The n$^+$ region is the heavily-doped epitaxial layer 112 in FIG. 1B.) For example, at 900° C., $w_{Si}$ is 4.0% (from the left liquidus branch of the phase diagram because excess Si is available for the limited Ag to dissolve) and $t_{Si}/t_{Ag}$ is 0.188, while at 1000° C., $w_{Si}$ is 5.8% and $t_{Si}/t_{Ag}$ is 0.278. The depth of the junction beneath the Ag region for a contact alloyed at temperature T is then given by:

$$x_j(T)=\Delta t_{Si}(T)=\{[t_{Si}/t_{Ag}](T)-[t_{Si}/t_{Ag}](T_{eutectic})\}*t_{Ag} \quad (2)$$

Equation (2) shows that $x_j$(T=900° C.) is 0.044*$t_{Ag}$ and $x_j$(T=1000° C.) is 0.134*$t_{Ag}$. For example, a 10 µm thick Ag layer will dissolve 1.88 µm of Si at 900° C. and create a junction depth of 0.44 µm upon epitaxial re-growth, while at 1000° C. a 10 µm thick Ag layer will dissolve 2.78 µm of Si and create a junction depth of 1.34 µm.

It is noteworthy that semiconductors other than silicon interact with silver in a similar way. In particular, the binary phase diagram of germanium with silver exhibits a eutectic at 650 C. having composition 81% silver and 19% germanium by weight. The melting point of germanium is 937 C. Like silicon, germanium is a member of Group IV of the periodic table so that elements from Group III and Group V act as p-type and n-type dopants in germanium, respectively. Germanium also crystallizes in the diamond cubic structure, like silicon. This means that the concept of a self-doping contact, as described above for silicon and silver, can be extended to germanium and to semiconductor alloys of silicon and germanium.

EXPERIMENTAL RESULTS

Embodiments of this invention have been tested experimentally with silicon using both evaporated Ag layers and screen-printed Ag layers, and the key features of the self-doping alloyed Ag contacts have been demonstrated. Diodes and resistors were made using evaporated Ag along with liquid P and B dopants. Electrical measurements, including current-voltage (I–V) curves and spreading resistance profiles, as well as examinations by scanning electron microscopy (SEM), scanning Auger microanalysis (SAM), and secondary ion mass spectroscopy (SIMS) confirmed the creation of a self-doping contact when the processing temperature exceeded the eutectic temperature. Contact (interface) resistance and bulk metal resistivity were consistent with an effective ohmic contact. In addition, an experimental Ag paste has been formulated where the individual Ag particles have a coating which acts as a source of P dopant. Optical microscopy has shown that this paste gives rise to Ag—Si alloying. I–V curves for resistors and diodes, type-testing, and measurements of contact resistance and spreading resistance all show that this paste is self-doping. Solar cell grid patterns, and prototype dendritic web solar cells have also been made using this paste. Such a paste is desirable as a cost-effective means of implementing self-doping contacts in solar cells.

Samples were prepared using dendritic web silicon substrates, 2.5 cm×10.0 cm in area, approximately 120 $\mu$m thick, and doped n-type (Sb) to approximately 20 $\Omega$-cm. A layer of Ag, 2–4 $\mu$m thick, was evaporated on one side of the substrate and a layer of Al, 2–4 $\mu$m thick, was evaporated on the opposite side. A coating of Filmtronics P507 liquid phosphorus dopant from Filmtronics Semiconductor Process Materials of Butler, Pa., was painted onto the Ag surface in most cases and then dried. Heat treatment was done in a Modular Process Technology (MPT) model 600S rapid thermal processing (RTP) unit at temperatures ranging from 800° C. to 1000° C., typically for 2 minutes in flowing argon (Ar) gas. With this temperature range, the Al—Si eutectic temperature (577° C.) was always exceeded, so the Al always gave rise to a $p^+$ layer. However, the Ag—Si eutectic temperature (835° C.) was exceeded in some cases and not in others. In addition, some test structures were processed over the same temperature range with no P507 phosphorus dopant layer applied to the Ag surface.

In a first experiment, a starting structure comprising an n-type Si substrate contacted by a layer of Ag was, in turn, coated with a layer containing a dopant. The structure was subjected to 900° C., 2 minute, RTP heat treatment, and then cooled. Under SEM inspection (without the Ag layer removed), two distinct regions on the Ag surface were clearly evident as expected from the phase diagram of FIG. 5 and the schematic of the Ag—Si eutectic layer 118 of FIG. 1B. Auger spectroscopy with depth profiling was used to show that darker regions were Si and lighter regions were Ag. Symmetrical patterns reflected the surface orientation of the Si web substrate. Thus, alloying of Ag and Si occurred, as expected, since the processing temperature (900° C.) exceeded the eutectic temperature (835° C.). Several small particles (approximately 1–2 $\mu$m) of Ag were also present on the surface.

Figure 6:
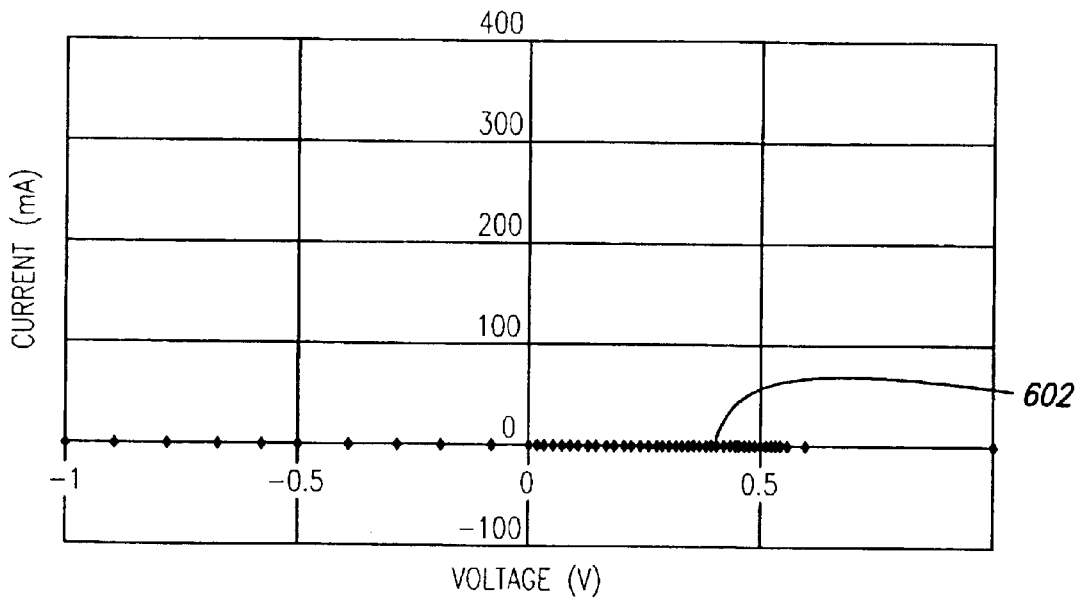
FIG. 6 shows a current versus voltage plot of a Ag/np+/Al sample structure after 800 degrees C., two minute heat treatment.

In a second experiment, a 2.5 cm×10.0 cm P507/Ag/n-Si/Al substrate structure was processed at 800° for 2 minutes. After cooling, a 2.0 cm×2.0 cm sample was cut from the structure and electrically tested. The resultant I–V curve 602, represented in FIG. 6, indicated only very high resistance exceeding 1 k$\Omega$-cm$^2$. Such a high resistance is a consequence of the failure of the Ag and Si to alloy, since the processing temperature was below the eutectic temperature. Consequently, there was no liquid region formed and no way for the dopant to become incorporated into the surface of the Si. This was confirmed by examining the Si surface under SEM inspection after the Ag was removed by etching. The surface was featureless, indicating no alloying and no self-doping action. Only a highly-resistive Ag/np$^+$/Al structure was created.

In a third experiment, a 2.5 cm×10.0 cm P507/Ag/n-Si/Al substrate structure was processed at 900° for 2 minutes. After cooling, a 2.0 cm×2.0 cm sample was cut from the structure and electrically tested. The resultant I–V curve 702, represented in FIG. 7, indicated the formation of a self-doping Ag/n$^+$np$^+$/Al structure, and the creation of a textbook-like Si diode. The low-leakage p$^+$n junction is an Al alloy junction. The low resistance ohmic contact to the n-type substrate follows from the alloying action of Ag, in conjunction with a P dopant source, to create the n$^+$ layer. After the Ag was removed by etching, SEM inspection revealed that the Si surface exhibited a distinct topography associated with the formation of the Ag—Si eutectic. As represented in FIG. 1B, the Si columns 114 were raised approximately 2 $\mu$m above the floor of the silicon 112 which had been covered with the Ag portions of the eutectic layer 118 prior to Ag etching. A measurement of the sheet resistance of the front Si n$^+$ surfaces gave 70 $\Omega$/□ for the surface. Other measurements showed that the resistivity of the Ag—Si eutectic contact metal is 2.0 times as high as the resistivity of the evaporated Ag. However, the resistivity of the eutectic metal is still quite low at ≈6 $\mu\Omega$-cm, considering the handbook value of resistivity for bulk Ag is 1.6 $\mu\Omega$-cm.

In a fourth experiment, a 2.5 cm×10.0 cm P507/Ag/n-Si/Al substrate structure was processed at 1000° for 2 minutes. After cooling, a 2.0 cm×2.0 cm sample was cut from the structure and electrically tested. The resultant I–V curve was essentially identical to curve 702 represented in FIG. 7, and again indicated the formation of a self-doping Ag/n$^+$np$^+$/Al structure, and the creation of a textbook-like Si diode. A measurement of the sheet resistance of the front Si n$^+$ surfaces gave 40 $\Omega$/□ for the surface. Other measurements showed that the resistivity of the Ag—Si eutectic contact metal is 2.2 times as high as the resistivity of the evaporated Ag. In both the third and fourth experiments, the structure 201 of FIG. 2B was therefore realized in practice.

Figure 7:
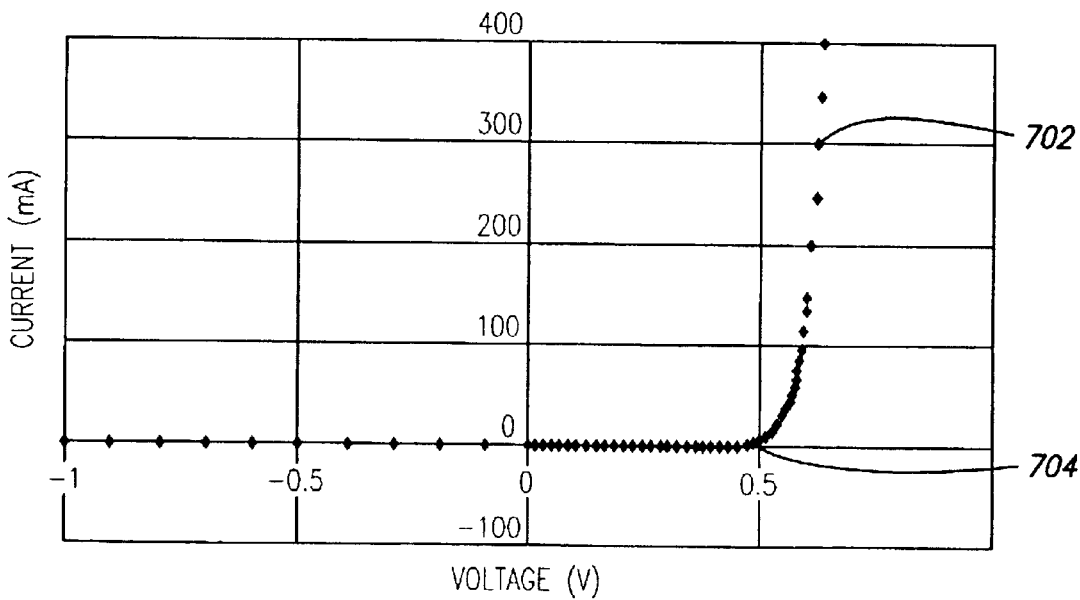
FIG. 7 shows a current versus voltage plot of a Ag/n+ np+/Al sample structure after 900 degrees C., two minute heat treatment.
Figure 13:
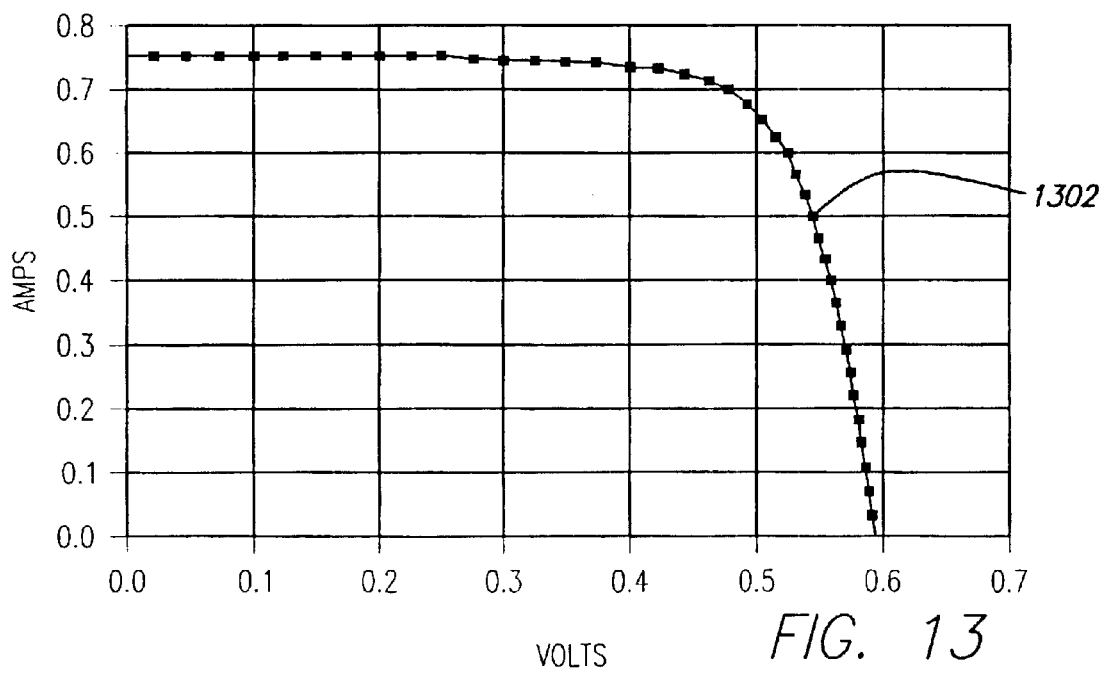
FIG. 13 shows a current versus voltage plot, measured under an illumination level of 100 mW/cm$^2$, of a fully metallized solar cell with self-doping contacts formed according to an embodiment of the present invention.

An estimate of the I–V curve that might result if this process were applied to a dendritic web silicon solar cell structure can be made by translating the I–V curve 702 of FIG. 7 downward along the current axis by 120 mA (typical $J_{SC}$ value of 30 mA/cm$^2$). Such an estimate gives $V_{OC}$ of 0.57 V, Fill Factor (FF) of 0.78, and efficiency ($\eta$) of 13%. The sharp knee 704 of the diode I–V curve 702 (as also indicated by the high estimated FF), the high estimated $V_{OC}$, and the low reverse bias leakage current all suggest that Ag is not contaminating the Si substrate or the p-n junction at 900° C. or 1000° C. The implication is that high efficiency solar cells can be made with this contact system. This was later confirmed when complete solar cells were fabricated using a self-doping silver paste, as shown in FIG. 13.

Figure 8:
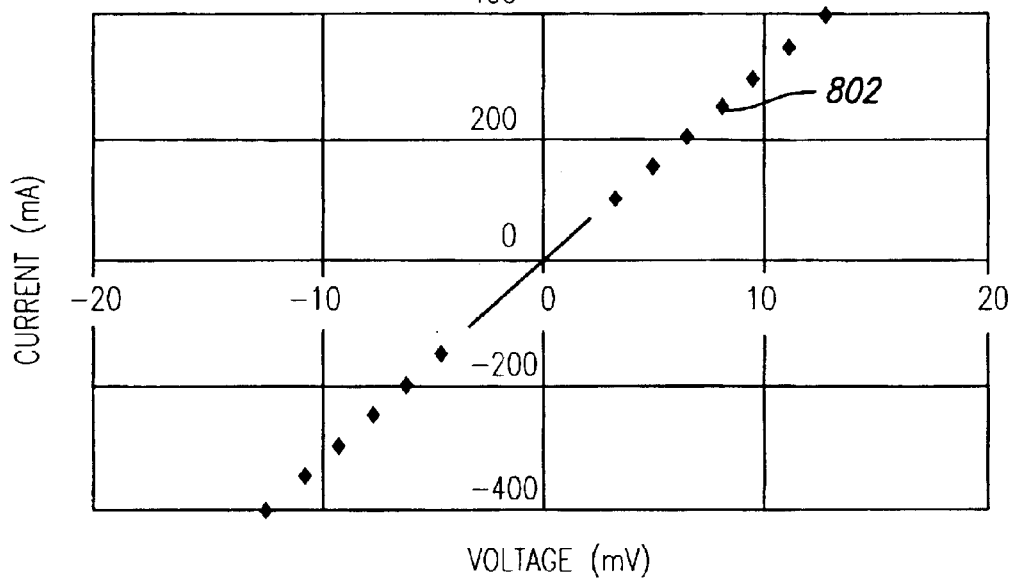
FIG. 8 shows a current versus voltage plot of a Ag/n+ nn+/Ag resistor structure obtained with phosphorus dopant on both Ag surfaces, processed at 900 degrees C. for two minutes.

Additional information regarding contact resistance was obtained by evaporating approximately 2 μm Ag on both sides of an n-type web substrate and applying phosphorus liquid dopant to both Ag surfaces for a starting structure of P507/Ag/n-Si/Ag/P507. After RTP alloying at 900° C. for 2 minutes, the linear I–V curve 802 of FIG. 8 was obtained, indicating the formation of a resistor with a Ag/n$^+$nn$^+$/Ag structure. From the slope of the I–V curve 802, a specific resistance of 0.12 Ω-cm$^2$ is obtained. This can be attributed entirely to the resistance of the silicon substrate, indicating a negligible contact resistance associated with the Ag metal and Ag/Si interface.

Figure 9:
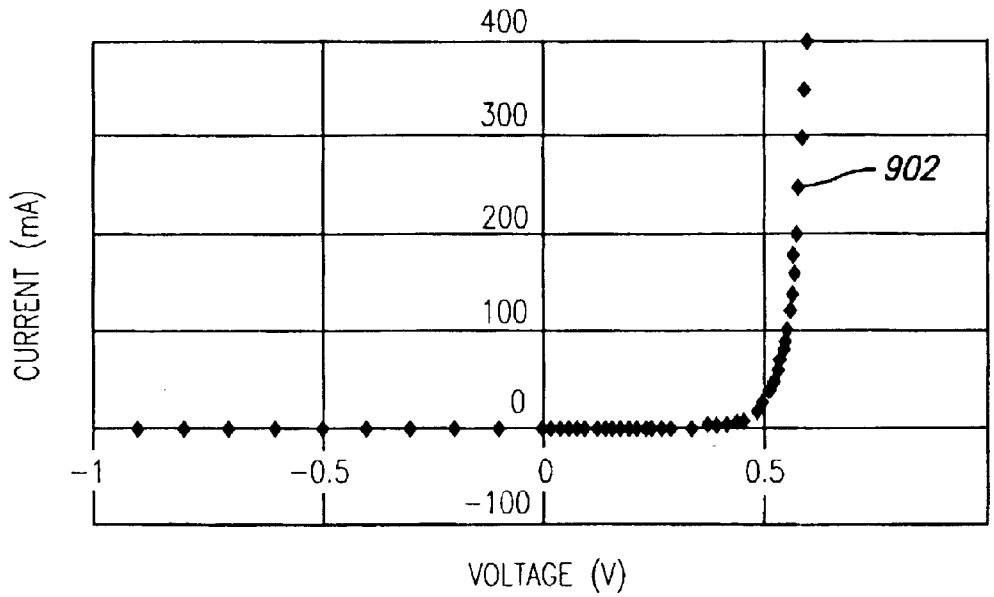
FIG. 9 shows a current versus voltage plot of a Ag/n+ np+/Ag diode structure obtained with phosphorus dopant on one Ag surface and boron dopant on the other Ag surface, processed at 900 degrees C. for two minutes.

To illustrate the versatility of the Ag-based self-doping contact system, phosphorus liquid dopant was applied to one Ag surface and a commercial boron liquid dopant (Boron-A) from Filmtronics was applied to the other Ag surface to give a starting structure of P507/Ag/n-Si/Ag/Boron-A. After RTP alloying at 900° C. for 2 minutes, the rectifying I–V curve 902 of FIG. 9 was obtained, indicating the formation of a Ag/n$^+$np$^+$/Ag structure in one high-temperature step. In this case the p-n junction was formed by alloying Ag with Si in the presence of B dopant, while ohmic contacts followed from the creation of the n$^+$ and p$^+$ layers in intimate contact with the Ag—Si eutectic layer. The structure 301 of FIG. 3B was therefore realized in practice.

Figure 10:
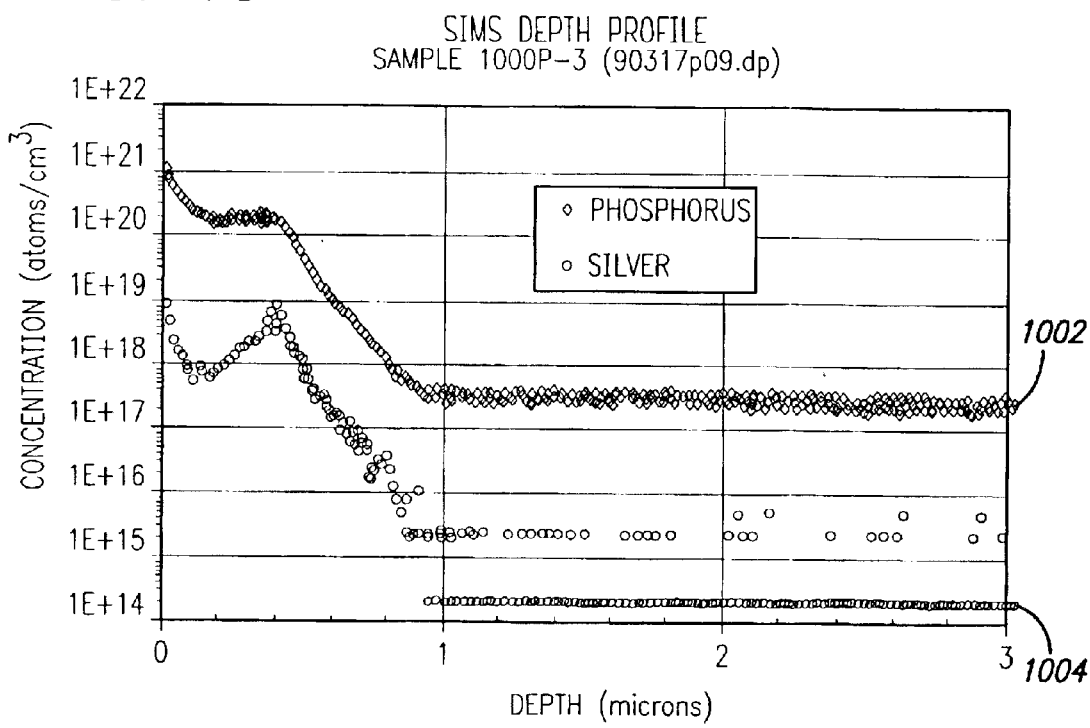
FIG. 10 shows a phosphorus and silver depth profile of a sample after removal of the front silver surface, alloyed at 1000 degrees C. for two minutes.

Measurements of I–V curves and sheet resistance indicated P had been incorporated into the Si to form an n$^+$ layer during alloying, but did not detect P directly. SIMS was employed to determine the composition of the surface layer for samples taken in the second, third and fourth experiments after the front Ag was removed. Data showed doping of 2×10$^{20}$ P/cm$^3$ to a depth of 0.3 μm at 900° C., 2×10$^{20}$ P/cm$^3$ to a depth of 0.4 μm at 1000° C., and no appreciable P-doping at 800° C., in good agreement with diode I–V curves. This shows that a necessary condition for the formation of a self-doping contact is that Ag alloy with Si, i.e., that the processing temperature exceed the eutectic temperature of 835° C. As seen in FIG. 10, Ag appeared to be below the detection limit (<1×10$^{15}$ Ag/cm$^3$) at depths greater than 1 μm, suggesting that Ag will not contaminate the Si in the alloying process (in agreement with the diode I–V curve 702 of FIG. 7). The SIMS depth profile 1002 for P and depth profile 1004 for Ag for the sample alloyed at 1000° C. for 2 minutes is shown in FIG. 10, where an n$^+$n junction depth of 0.4 μm is indicated. From Equation (2) this depth implies a starting Ag thickness of 3.0 μm, which is consistent with the estimated thickness of evaporated Ag of 2–4 μm. The gradual reduction in measured P and Ag concentrations from 0.4 μm to 1.0 μm in FIG. 10 may be associated with the Si columns in the eutectic layer which are presumed to contain P and Ag. The overall P concentrations and junction depths obtained by SIMS are in reasonable agreement with those obtained by spreading resistance measurements.

Some Ag/n-Si/Al samples were prepared with no dopant coating on the Ag layers. After processing under the same conditions described previously (temperatures up to 1000° C.), I–V curves showed extremely high series resistance. This demonstrates that self-doping action does not occur because of the Ag itself, but only if a dopant coating is applied to the Ag surface. These experiments suggest that conditions for achieving a self-doping Ag contact to Si are:

1. Coating the Ag surface with a dopant source;
2. Using a processing temperature which exceeds the Ag—Si eutectic temperature so that alloying of Ag with Si occurs.

The self-doping alloyed Ag contact system has also been implemented in a screen-printing paste. DuPont Electronic Materials, Research Triangle Park, N.C., has formulated an experimental paste in response to a request and specification from EBARA Solar. This paste is designated by DuPont as E89372-146A, and contains Ag particles which are coated with a layer which contains P.

The ability of the 146A paste to create a self-doping contact was demonstrated by converting the surface of a p-type dendritic web silicon substrate to n-type. A p-n junction diode (sample 146A–1000p) was fabricated with a low-resistivity p-type web (0.36 Ω-cm) serving as the starting substrate. A back ohmic contact was made by alloying Ferro FX-53-048 Al paste to make a pp$^+$ structure. DuPont 146A paste was then printed over nearly the entire front of the blank (2.5 cm×10.0 cm) and dried (200° C., 10 minutes, Glo-Quartz belt furnace). Binder burnout and Ag alloying were done in the MPT RTP, with alloying at 1000° C. for 2 minutes in Ar. A 2 cm×2 cm piece was cut from the blank. The measured I–V curve was rectifying, with a shunt resistance of 1.6 kΩ-cm$^2$, a soft turn-on voltage of ≈0.5 V and series resistance in the forward direction<0.94 Ω-cm$^2$. The creation of a diode on a p-type substrate indicates an n$^+$ layer was formed beneath the 146A metal, as desired, to give a Ag/n$^+$pp$^+$/Al structure. This was confirmed by removing the Ag metal in HNO$_3$. The underlying Si was found to be strongly n-type by a hot probe type tester, and the sheet resistance was measured in the range 4-28 Ω/□. Thus, the front Si structure was confirmed to be n$^+$p, with 146A paste supplying the n-type dopant. For comparison, another p-type web blank was printed with DuPont E89372-119A Ag paste, which is similar to the 146A paste but without the phosphorus-containing coating, and alloyed as above. Upon stripping the Ag from the front, the underlying Si tested p-type, as expected, since the 119A has no source of P. The supposed structure then is Ag/pp$^+$/Al for the 119A paste which is not self-doping. This confirmed that the structure 401 of FIG. 4 was realized in practice with the 146A paste.

Figure 11:
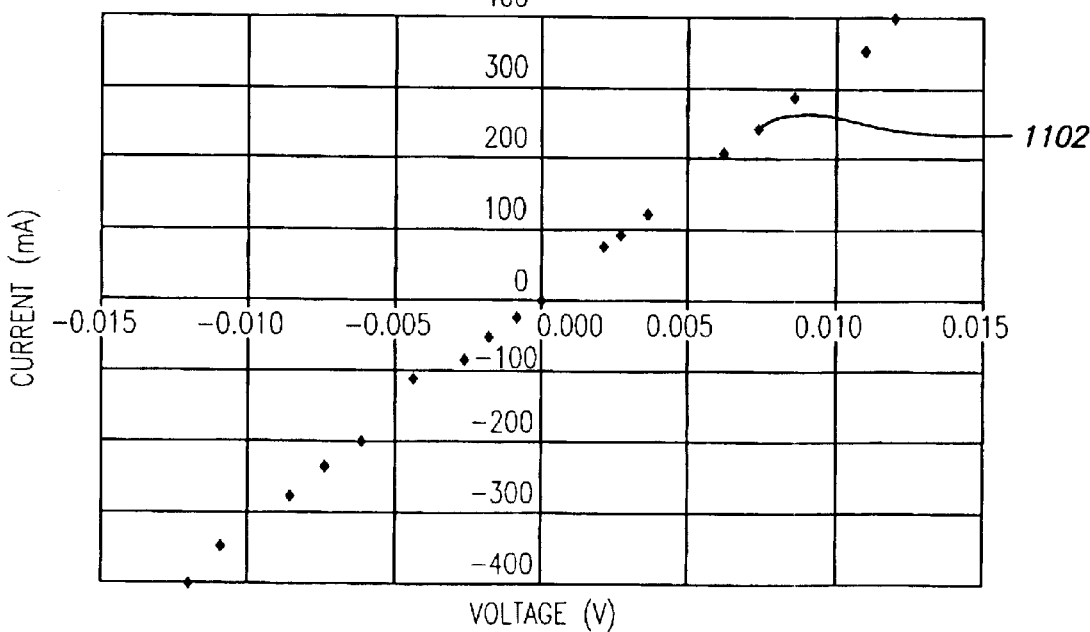
FIG. 11 shows a current versus voltage plot of a fully metallized resistor structure with self-doping contacts formed according to an embodiment of the present invention.

Additional work with the 146A paste further confirmed its ability to serve as a self-doping contact material. A fully metallized Ag/n$^+$nn$^+$/Ag resistor and a Ag/n$^+$np$^+$/Al diode were fabricated using n-type web silicon cell blanks (2.5 cm×10.0 cm) in one high temperature step (900° C., 2 minutes, 1 slpm Ar) in the MPT RTP. The source of Al for the diode was the commercial Ferro FX-53-048 Al paste. Alloying of Ag with Si was uniform, with only small balls of metal appearing on the surface and no unalloyed areas. Good ohmic contact was obtained for the resistor (0.12 Ω-cm$^2$, including 0.07 Ω-cm$^2$ resistance of bulk Si) as shown in FIG. 11. The linear I–V curve 1102 demonstrates ohmic contact to the 7 Ω-cm n-type dendritic web Si substrate. Total resistance of 0.12 Ω-cm$^2$ includes 0.07 Ω-cm$^2$ associated with the Si (nominal thickness of 100 μm), leaving an estimated net Ag/n$^+$ contact resistance of 25 mΩ-cm$^2$.

Figure 12:
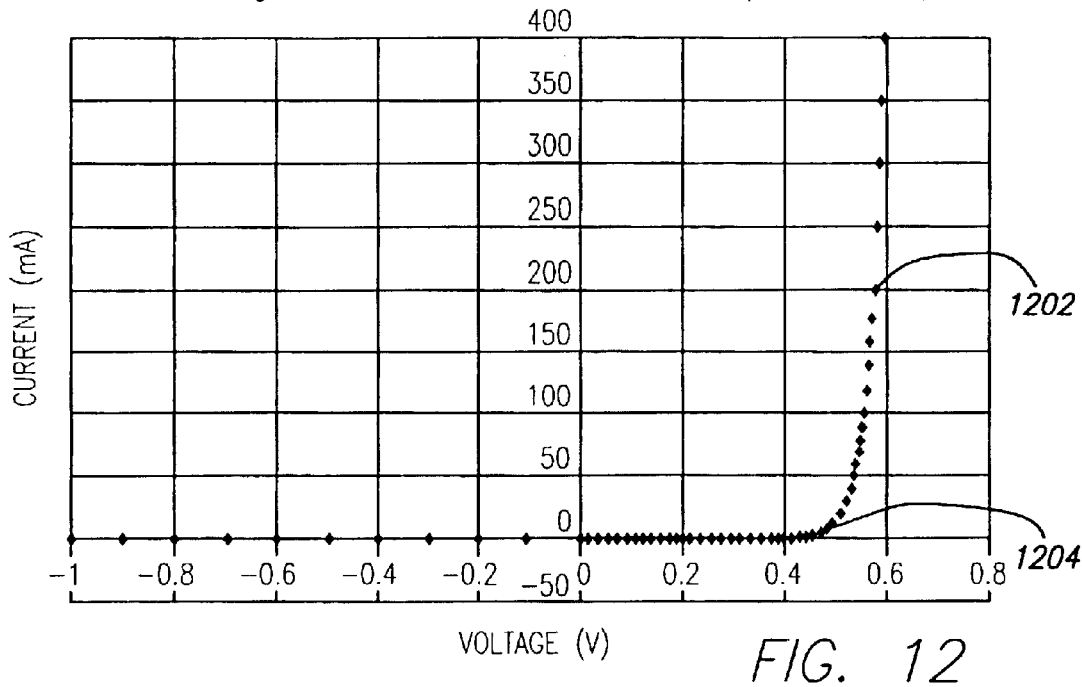
FIG. 12 shows a current versus voltage plot of a fully metallized diode structure with self-doping contacts formed according to an embodiment of the present invention.

Turning to FIG. 12, the Ag/n$^+$np$^+$/Al diode was also shown to have very low leakage current as indicated by its high shunt resistance. Dendritic web Si substrate was nominally 100 μm thick and had a resistivity of 7 Ω-cm. Note the low leakage current (as represented by curve 1202) and the sharp knee 1204 of the curve.

The ability to print and alloy patterns using the 146A Ag paste was also demonstrated. A solar cell grid pattern with Ag lines having a nominal 100 μm width was printed and alloyed, along with a contact resistance test pattern utilizing the current transfer length method (TLM) comprising a series of bars 1 mm wide and 25 mm long. The contact resistance test pattern was printed on 6.8 Ω-cm n-web (no diffused layer) and fired at 950° C. in the MPT RTP. This gave uniform, adherent contacts which showed evidence of Ag—Si alloying (triangles reflecting the web silicon surface, apparent two-phase region at the surface), and measured contact resistance of 2.8 mΩ-cm$^2$ for the 146A paste. It was further determined that phosphorus from the Ag was doping the Si beneath the metal by stripping the metal and probing the Si surface using the spreading resistance technique. Measured spreading resistance decreased by a factor of 1000 when the probes passed from the region beside the Ag bar (6.8 Ω-cm) to the region originally beneath the Ag bar. This implies a surface concentration of $8 \times 10^{18}$ P/cm$^3$ supplied by the 146A paste. Simultaneous type testing also confirmed that both the substrate and the region beneath the metal were n-type.

The bulk resistivity of the screen-printed and alloyed 146A paste has been measured to be 5 μΩ-cm, which is sufficiently low and not much greater than the 1.6 μΩ-cm value for pure Ag. Tabs used for interconnecting cells in a module have also been soldered to the alloyed 146A surface. Thus, electrical conductivity and solderability of the 146A paste have been demonstrated.

The DuPont 146A fritless, self-doping paste was used to form the negative contact to PhosTop web solar cells with an Ag/n$^+$pp$^+$/Al structure, and having n$^+$ sheet resistances of 35 Ω/□ and 70 Ω/□ (Lot PhosTop-46). Alloying of 146A Ag was done in the MPT RTP at 900° C. for 4 minutes. Results are tabulated in Table 1 below for cells fabricated without an anti-reflective (AR) coating. Commercial Ferro 3347 fritted Ag paste, fired in a belt furnace at 730° C., is included for comparison. In all cases Al alloying in a belt furnace at 850° C. followed the P diffusion and preceded the Ag alloying or firing. At 35 Ω/□, where the Si surface is pre-doped liberally with P, cell efficiency for the self-doping 146A Ag is comparable to, but no better than, that for the 3347 Ag. However, at 70 Ω/□ the 146A gives considerably better efficiency than does the 3347. The reason for this is that the series resistance is quite high (approximately 20 Ω-cm$^2$) for 3347 because of an insufficient concentration of P at the Si surface, but is at an acceptable level for 146A which supplies its own P. These results show that the 146A Ag paste enables the use of a more lightly-doped P layer, which is expected to lead to higher efficiency cells when the Si surface is properly passivated. It is also expected that an alloying process which can be executed in a belt furnace rather than an RTP can be developed for 146A to achieve higher throughput and lower cost.

Additional work was done in which self-doping Ag pastes were alloyed after P diffusion, but before Al alloying. DuPont 146A fritless Ag paste as well as DuPont 151B fritted Ag paste were used. Ag particles in the 151B paste were identical to those in the 146A paste in that a phosphorus-containing coating had been applied to them, but glass frit had been added to the coated paste so that 151B was a fritted version of the 146A Ag paste. The best results obtained when Ag alloying (900° C. for 4 minutes in the MPT RTP for 146A or 940° C. for approximately 1 minute in a belt furnace for 151B) preceded Al alloying (800° C. for approximately 3 minutes in a belt furnace in both cases) are summarized in the Table 2 below.

TABLE 2

| Ag Paste | $R_{sheet}$ (Ω/□) | PhosTop Lot # | $J_{sc}$(no AR) (mA/cm$^2$) | $V_{oc}$ (V) | Fill Factor (FF) | Efficiency (%) |
| --- | --- | --- | --- | --- | --- | --- |
| DuPont 146A | 57 | 56 | 20.2 | 0.578 | 0.752 | 8.76 |
| DuPont 146A | 69 | 56 | 20.2 | 0.584 | 0.733 | 8.65 |
| DuPont 151B | 78 | 58 | 18.6 | 0.577 | 0.753 | 8.09 |

These data show that good fill factors and other solar cell parameters can be obtained when the self-doping Ag pastes are applied to a Si surface doped lightly (approximately 70 Ω/□) with P. An estimate of the efficiency expected if the three cells in the above table had an AR coating can be obtained by multiplying the observed efficiency (no AR) by 1.45. This gives 12.7%, 12.5%, and 11.7%, respectively, and confirms the expectations of FIG. 7 that screen-printed self-doping Ag contacts can be used for solar cells. Furthermore, the fact that the 151B fritted Ag paste can be alloyed in a belt furnace shows that such a paste is compatible with a practical, high-throughput process for forming contacts. The fabrication of cells made with the 151B Ag paste was accomplished by screen-printing (P, Ag, and Al) along with belt furnace P diffusion (870° C.), Ag alloying (940° C.) and Al alloying (800° C.).

Finally, dendritic web silicon solar cells having self-doping silver contacts were fabricated, complete with an anti-reflective (AR) coating. The AR coating was silicon nitride (nominal 86 nm thickness and 1.98 index of refraction), deposited by plasma-enhanced chemical vapor deposition (PECVD) onto the front n$^+$ silicon surface. This was followed by screen-printing and alloying aluminum to form the p$^+$n junction and back contact. The structure to which DuPont experimental 151A or 151B fritted self-doping Ag paste was applied was: SiN$_x$/n$^+$pp$^+$/Al. By virtue of the glass frit, these pastes were able to penetrate through the insulating silicon nitride layer to make ohmic contact to n$^+$ layers having sheet resistances up to 100 Ω/□. This high-throughput process was carried out in a radiantly heated belt furnace at 940 C. for 1 minute. The illuminated I–V curve 1302 for such a cell (Lot PhosTop-69, cell 111, 151A paste) is given in FIG. 13. Cell area is 25 cm$^2$, and doping of the n$^+$ layer is very light at 100 Ω/□. Cell

TABLE 1

| Ag Paste | $R_{sheet}$ (Ω/□) | # Cells | $J_{sc}$(no AR) (mA/cm$^2$) | $V_{oc}$ (V) | Fill Factor (FF) | Efficiency (%) |
| --- | --- | --- | --- | --- | --- | --- |
| Ferro 3347 | 35 | 30 | 20.2 ± 0.4 (20.7 best) | 0.578 ± 0.006 (0.583 best) | 0.758 ± 0.016 (0.779 best) | 8.86 ± 0.35 (9.24 best) |
| DuPont 146A | 35 | 10 | 18.6 ± 1.9 (20.5 best) | 0.557 ± 0.017 (0.587 best) | 0.724 ± 0.048 (0.767 best) | 7.49 ± 1.01 (9.04 best) |
| Ferro 3347 | 70 | 19 | 13.4 ± 1.8 (16.4 best) | 0.527 ± 0.009 (0.554 best) | 0.417 ± 0.091 (0.596 best) | 3.02 ± 0.99 (4.75 best) |
| DuPont 146A | 70 | 10 | 19.0 ± 0.3 (19.5 best) | 0.557 ± 0.005 (0.563 best) | 0.728 ± 0.011 (0.743 best) | 7.69 ± 0.23 (8.09 best) | efficiency is 13.4%, with $J_{SC}$ of 30.0 mA/cm$^2$, $V_{OC}$ of 0.593 V, and FF of 0.752. In spite of the very light n$^+$ doping, the series resistance for this cell was determined to be 0.70 $\Omega$-cm$^2$, well within the 1 $\Omega$-cm$^2$ limit desired. Attempts to use commercial Ferro 3347 Ag paste failed for n$^+$ sheet resistances above 45 $\Omega$/□ because of excessive series resistance.

The ability of screen-printed 151A and 151B Ag pastes to penetrate the silicon nitride and make ohmic contact to a lightly-doped n$^+$ layer using a high-throughput belt furnace process demonstrates a commercially-viable material and process. Furthermore, measurements of contact resistance (current transfer length method) of 151A and 151B contacts through PECVD silicon nitride AR coatings to 60 $\Omega$/□ n$^+$ layers gave 3 m$\Omega$-cm$^2$, equivalent to a series resistance of just 0.03 $\Omega$-cm$^2$. Commercial Ferro 3347 Ag gave 500 m$\Omega$-cm$^2$ contact resistance under the same conditions, equivalent to a series resistance of 5 $\Omega$-cm$^2$, considerably above the 1 $\Omega$-cm$^2$ limit. Measured bulk resistivity of the 151A and 151B Ag contact material was quite low at 2 $\mu\Omega$-cm, and the contacts were readily solderable.

Considering the test results in total for the DuPont E89372-146A fritless paste and the DuPont E89372-151A and 151B fritted pastes, it is clear that a self-doping Ag paste has been realized for making ohmic contact to n-type silicon. Such pastes, or a successors to them, are expected to provide a practical, cost-effective material for making self-doping negative electrodes to solar cells and other Si devices by alloying the dopant-coated Ag with Si. There is no obvious reason why silver pastes incorporating coatings of a p-type dopant could not be made as well. In theory, the process should also be applicable to other substrates such as germanium and silicon-germanium alloys.

The foregoing description of the preferred embodiments of the present invention is by way of example only, and other variations and modifications of the above-described embodiments and methods are possible in light of the foregoing teaching. The embodiments described herein are not intended to be exhaustive or limiting. The present invention is limited only by the following claims.

What is claimed is:

1. A method of manufacturing a contact, comprising:

providing a semiconductor having a surface;

providing a plurality of silver granules;

covering at least a portion of the plurality of the silver granules with a layer of dopant, the dopant being capable of doping the semiconductor;

forming a paste from at least a portion of the plurality of silver granules and dopant;

applying the paste to at least a portion of the surface;

heating the paste and the semiconductor to a first temperature;

maintaining the first temperature until at least a portion of the paste and a portion of the semiconductor form a molten alloy;

cooling the alloy to a second temperature that is below the first temperature such that at least a portion of the dopant contained in the molten alloy is incorporated into an expitaxial re-growth region of the semiconductor, and the molten alloy becomes a solid solderable contact with ohmic electrical contact to at least a portion of the re-growth region.

2. The method of claim 1, wherein the semiconductor is selected from the group consisting of silicon, germanium, and silicon-germanium alloy.

3. The method of claim 1, wherein the first temperature is above eutectic temperature for the silver granules and the semiconductor.

4. The method of claim 1, wherein maintaining comprises maintaining the first temperature for a duration of at least one minute.

5. The method of claim 1, wherein applying the paste is accomplished by screen-printing.

* * * * *